United States Patent [19]

Moon

[11] Patent Number: 5,655,926

[45] Date of Patent: Aug. 12, 1997

[54] SOCKET FOR SEMICONDUCTOR DEVICE

[75] Inventor: Ji-Young Moon, Kyeungsangbuk-do, Rep. of Korea

[73] Assignee: LG Semicon Co., Ltd., Seoul, Rep. of Korea

[21] Appl. No.: 550,238

[22] Filed: Oct. 30, 1995

[30] Foreign Application Priority Data

Nov. 1, 1994 [KR] Rep. of Korea .................. 94-28892

[51] Int. Cl.⁶ .................................................. H01R 11/18
[52] U.S. Cl. ........................................ 439/482; 439/72
[58] Field of Search ................................ 439/70, 71, 72, 439/73, 331, 482, 912.1

[56] References Cited

U.S. PATENT DOCUMENTS

| | | | |
|---|---|---|---|
| 3,656,183 | 4/1972 | Waltersheid | 439/331 |
| 4,739,257 | 4/1988 | Jenson et al. | 439/71 |
| 4,887,969 | 12/1989 | Abe | 439/73 |
| 5,067,904 | 11/1991 | Takeuchi et al. | 439/73 |
| 5,154,619 | 10/1992 | Matsuoka | 439/70 |
| 5,195,903 | 3/1993 | Uratsuji | 439/266 |
| 5,395,255 | 3/1995 | Kato | 439/72 |
| 5,504,435 | 4/1996 | Perego | 439/71 |

*Primary Examiner*—Neil Abrams
*Assistant Examiner*—Brian J. Biggi

[57] ABSTRACT

A socket for use in electrically measuring and testing a semiconductor device including a body portion having a guide for holding leads of the semiconductor device, and a cover with a plurality of probes for contacting with the leads of the semiconductor device. The cover has a plurality of out-leads respectively connected to the probes to communicate electrical signals from the probes to an exterior device. The guide of the body portion is provided with a plurality of lead guide holes, and a biasing member for urging the guide toward the cover to ensure consistent contact between each of the probes and a corresponding lead.

4 Claims, 3 Drawing Sheets

Prior Art

SOCKET FOR SEMICONDUCTOR DEVICE

BACKGROUND OF THE INVENTION

1. Technical Field of the Invention

The present invention relates to a socket for a semiconductor device, and more specifically to a socket for use in measuring electrical characteristics of a semiconductor device.

2. Description of the Prior Art

A conventional socket which has been used for electrically testing a semiconductor device includes a body 10 and a cover 20 as shown in FIGS. 1 and 2.

With reference to FIG. 1, a conventional socket with a body 10 and a cover 20 is shown in an open position. The body 10 is provided with a guide 15 into which the leads of the semiconductor device 30 are placed. The guide 15 is provided with a plurality of guiding grooves 17 disposed at intervals corresponding to the lead intervals of the device. The cover 20 is pivotally connected to a projecting portion 12 of the body 10. A surface of the cover 20 facing the body 10 supports a push projecting portion 21 in a position aligned with the guide 15.

FIG. 2 shows a conventional socket in a closed position and holding a semiconductor device 30. Individual metal pads 11 are disposed at the bottom of each of the grooves 17. These metal pads 11 occur at the same intervals as the intervals of the leads 31 of the semiconductor device 30, so that the leads 31 and the metal pads 11 correspond when the semiconductor device 31 is coupled to the guide 15. Further, one of a plurality of out-leads 14 is connected to each of the metal pads 11 so as to connect them to the outside. This enables the semiconductor device to communicate with external devices through the combination of the socket's metal pads and out-leads.

The conventional socket uses a locking mechanism for holding the body 10 and cover 20 together. As discussed above, the cover 20 is rotatably mounted to a projecting portion 12, formed on one side of the body 10. An engaging step 13 is formed on another side of the body 10. The cover 20 pivots within a predetermined angular range with respect to the projecting portion 12 for allowing the socket to rotate into a closed position by engaging the locking portion 16 of the cover with the engaging step 16 of the body 10. Similarly, the socket may be opened by moving the locking portion 16 beyond the reach of the engaging step 16 for allowing the cover 20 to rotate to an open position.

The push projecting portion 21 elastically pushes the semiconductor device 30 toward the body 10 as the cover 10 is closed. The push projecting portion 21 is made of a pliable material that is capable of compression as it engages the semiconductor device 30. As the cover 20 is closed, the push projecting portion 21 contacts the semiconductor device 30 and compresses to maintain a constant force on the semiconductor device 30 to ensure that the leads 31 reach and remain in contact with the metal pads 11 for allowing the device to communicate through the out-leads 14 to outside devices.

Proper contact between the leads 31 and the metal pads 11 must be maintained for the socket to work reliably in testing and measuring the semiconductor device. When low voltage signals or high frequency signals are supplied to the semiconductor device, the electrical signals may be distorted or damped if the leads do not remain in contact with the metal pads. The result being that any measurements of the characteristics of the device 30 become inaccurate.

Unfortunately, a conventional socket has several inherent problems that prevent consistent contact between the semiconductor device and the socket. With the arrangement shown in FIGS. 1 and 2, the contacting state of the leads 31 with the metal pads 11 varies with the thickness of the semiconductor device 30 and with the thickness of the push projecting portion 21 of the cover 20. Thus, conventional sockets can only be used with semiconductor devices within a narrow range of thicknesses. For example, if the device width is smaller than the range of device width determined by the elasticity of the push projection portion, the push projection portion will not provide sufficient force on the device to ensure proper contact between the leads and the metal pads. Further, the thickness of the push projecting portion 21 may gradually decrease as the elasticity of the material comprising the push projecting position 21 decreases. This effectively narrows the range of device thicknesses that the socket can accommodate and still function reliably.

SUMMARY OF THE INVENTION

The present invention is intended to overcome the above-described disadvantages associated with conventional devices.

Therefore it is an object of the present invention to provide a socket for a semiconductor device in which the contact between the leads of the device and metal probes of the socket is consistently and reliably maintained, thereby improving the reliability of the measurement and testing of the semiconductor device.

It is a further object of the present invention to provide a socket capable of accepting semiconductor devices of various thicknesses.

In achieving the above objects, a socket according to the present invention for use in electrically measuring a semiconductor device includes a body portion having a guide for placing leads of the semiconductor device to be measured, and a cover engaged to one side of said body portion. The cover has a plurality of probes for contacting with leads of the semiconductor device as the socket is closed. The guide of said body portion is provided with a plurality of lead guide holes aligned on the guide to accommodate the leads of the semiconductor device being measured. An urging device, supported by said body portion, pushes the guide (with the semiconductor device supported thereon) toward the plurality of probes for promoting and maintaining electrical contact between the probes and the leads of the device being measured. The cover also has a plurality of outleads respectively connected to each the probes to transfer electrical signals from the semiconductor device through the combination of the probes and the outleads to the outside.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENT

Figure 1:
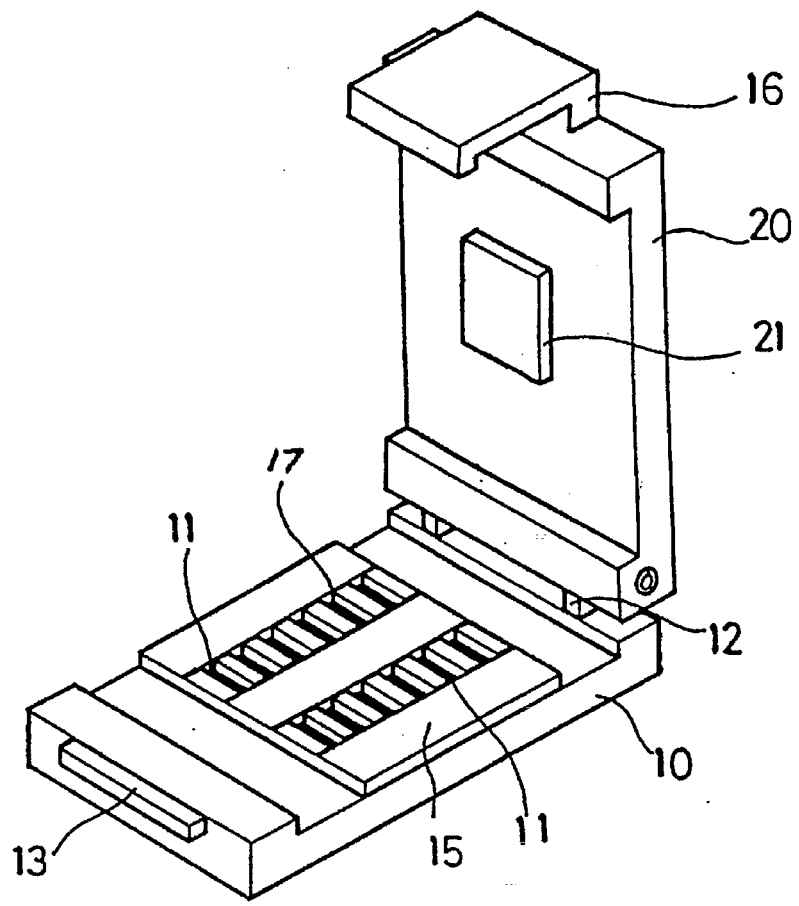
FIG. 1 is a perspective view of a conventional socket for a semiconductor device, with the socket cover being open.
Figure 2:
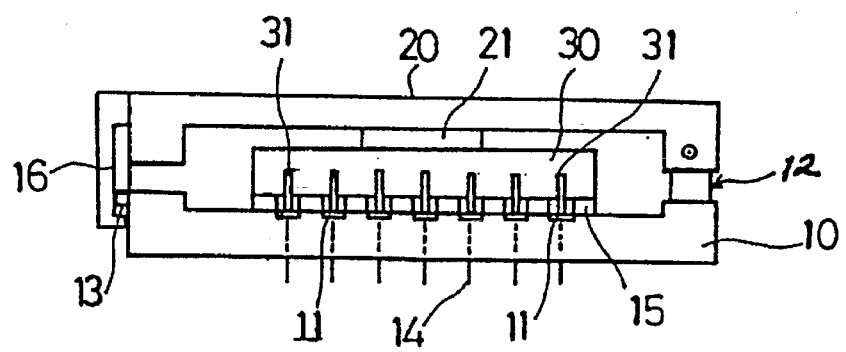
FIG. 2 is a side view of the conventional socket of FIG. 1, with a semiconductor device coupled to a closed conventional socket.
Figure 3:
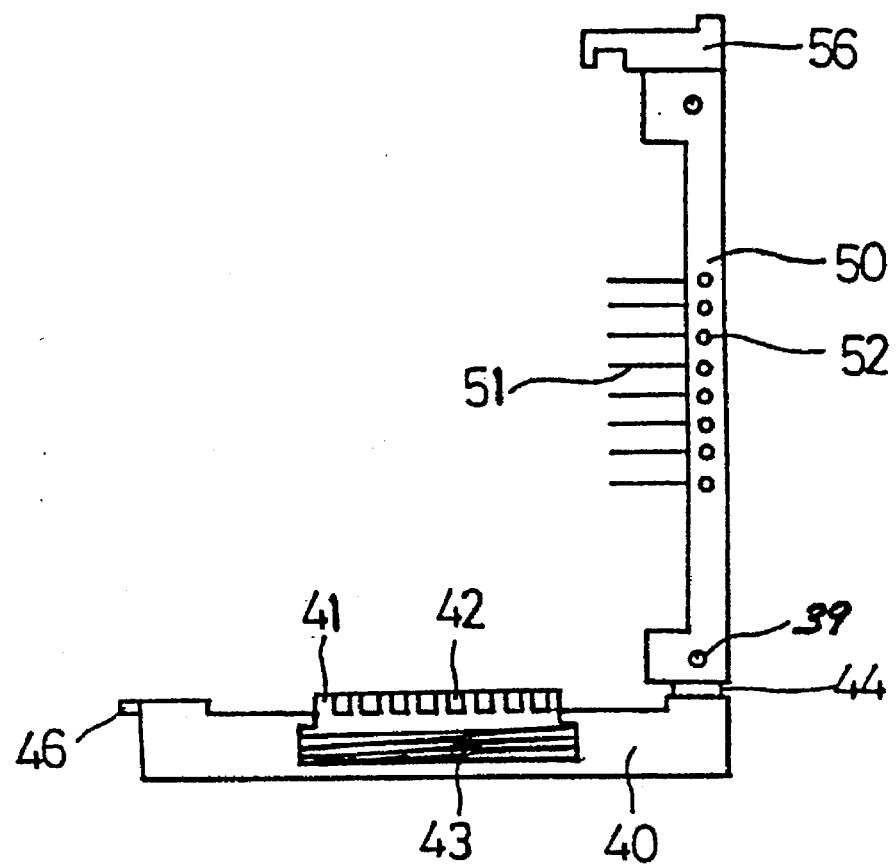
FIG. 3 is a side view of a socket for a semiconductor device according to a preferred embodiment of the present invention, with the socket cover being open.
Figure 4:
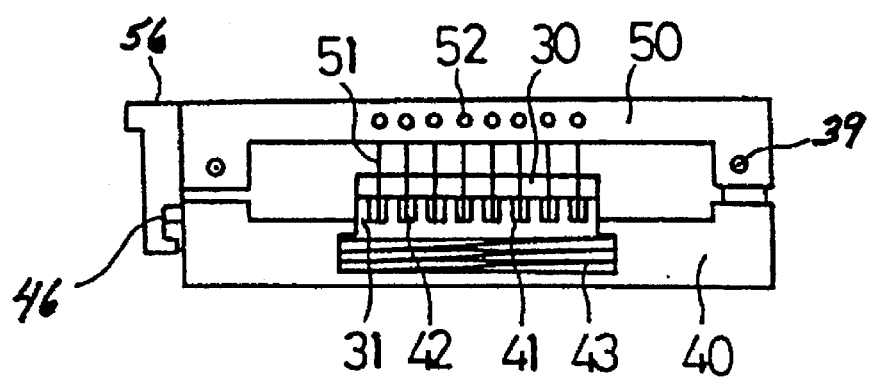
FIG. 4 is a side view of a socket for a semiconductor device according to a preferred embodiment of the present invention, with a semiconductor device coupled to it the closed socket.

As shown in FIGS. 3 and 4, the socket for a semiconductor device according to one preferred embodiment of the present invention includes a body portion 40 and a cover 50.

The body portion 40 is provided with a guide 41 having a plurality of lead guide grooves 42. The lead guide grooves 42 are disposed at intervals for receiving the leads of a semiconductor device. Each of the guide grooves 42 define a substantially straight guide for accommodating each lead to deter any bending or breaking of the leads when positioned on the socket.

The guide 41 is supported by a biasing member, e.g., spring 43. The spring 43 is located within an aperture in the body portion 40 to exert an elastic force against the guide 41 (and any semiconductor device supported by the guide) when compressed. The spring 43 is capable of producing sufficient elastic force to bring and to maintain the leads 31 in contact with the probes 51 without damaging either the semiconductor device 30 or the socket. The shape of the guide 41 is similar to a conventional guide except metal pads are not provided for contacting the leads of the device held by the socket.

The cover 50 is rotatably coupled by means of a shaft 39 to a projected portion 44 of the body portion 40. The projected portion 44 supports the cover 50 for pivotal movement about the shaft 39 between an opened position (FIG. 3) and a closed position (FIG. 4) within a prescribed angular range.

The cover 50 is provided with a plurality of probes 51 disposed at the same interval as the lead guide grooves 42 and leads 31 of the semiconductor device 30. The plurality of probes 51 extend in a direction substantially perpendicular to an inner surface of the cover 50. When closed, each of the probes 51 enter a corresponding lead guide grooves 42 and contact a lead 31 of the semiconductor device 30. Each of the probes 51 are also connected to a corresponding one of a plurality of out-leads 52 for transmitting signals to the outside. (FIG. 5).

The body portion 40 and the cover 50 are respectively provided with an engaging step 46 and a locking portion 56 which cooperate to lock the socket in the closed position similar to conventional sockets.

Figure 5:
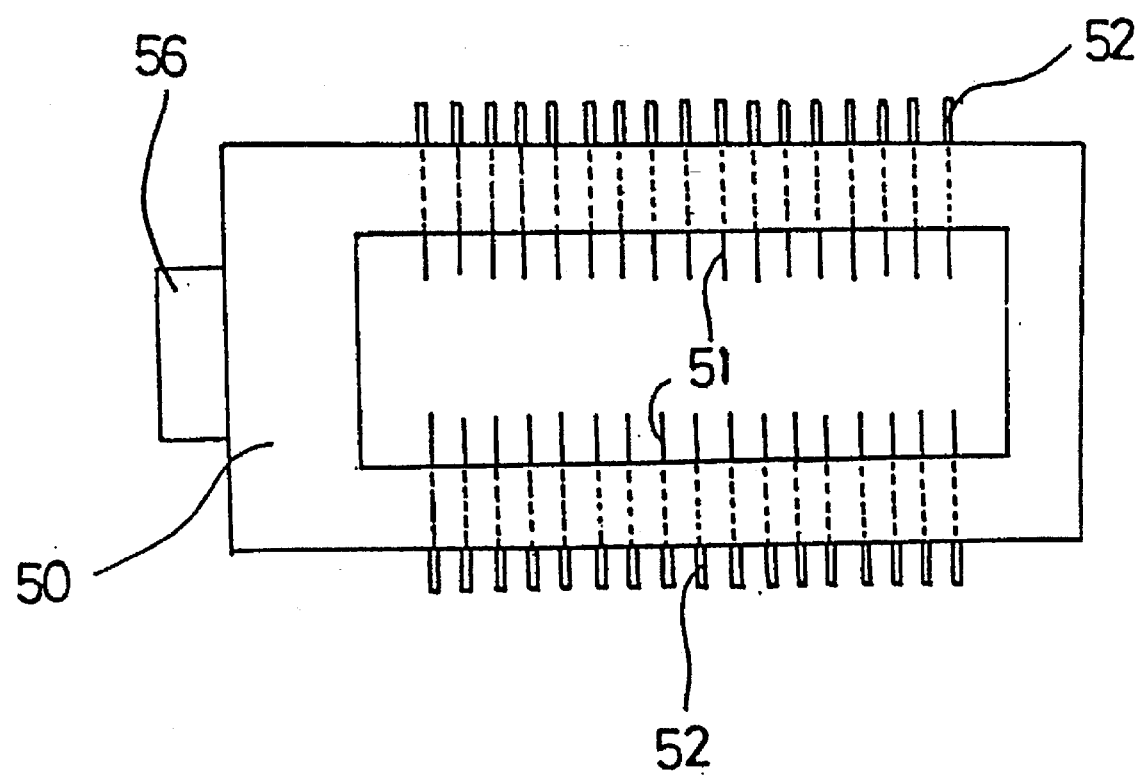
FIG. 5 is a plane view of the upper portion of a socket according to a preferred embodiment of the present invention.

FIG. 5 illustrates a plane view of the cover 50. The cover 50 supports the plurality of probes 51 and out-leads 52 in a spaced and substantially parallel relationship with respect to each other. Each of probes 51 is connected to an out-lead 52 for operatively connecting the semiconductor device 30 to an exterior device (not shown). As illustrated, the probes 51 extend inward from the outleads 52 from the edges of cover and then downward for engagement with the lead guide grooves 42 and leads 31 as shown in FIGS. 3 and 4.

The socket of the present invention as described above operates in the following manner.

With the socket in an open position as shown in FIG. 3, a semiconductor device 30 is positioned on the guide 41 of the body portion 40. Under this condition, the leads 31 of the semiconductor device 30 are inserted into the lead guide grooves 42.

Once the semiconductor device 30 is properly positioned, the socket is locked about the semiconductor device 30. As the cover 50 is closed, the probes 51 of the cover 50 penetrate the lead guide grooves 42 so as to contact with the leads 31 of the semiconductor device 30. The locking portion 56 extends over the engaging step 46 to lock the socket in the closed position as shown in FIG. 4.

As the probes 51 extend into the lead guide grooves 42, the spring 43 (which is installed under the bottom of the guide 41 as it supports the semiconductor device 30) pushes the guide 41 upward for ensuring consistent contacts between each of the leads 31 and a corresponding one of the probes 51. Even if the thickness of the semiconductor device 30 varies, or even if a thickness difference occurs as a result of the wearing of the cover 50 or guide 41, the contacts between the leads 31 and the probes 51 will always be consistent as a result of the elastic force of the spring 43. Therefore, the reliability of the socket for measurement and testing is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A socket for use in measuring and testing a semiconductor device having a plurality of leads, the socket comprising:

a body portion having guide means for supporting the semiconductor device by receiving the plurality of leads;

a cover for holding the semiconductor device against the body portion, the cover having a plurality of probes for respectively contacting a corresponding one of the plurality of leads of the semiconductor device for communicating electric signals to and from the semiconductor device; and means, supported by said body portion, for elastically urging said guide means toward said plurality of probes to promote contact between the plurality of leads and the plurality of probes.

2. The socket as recited in claim 1, wherein said guide means comprises a plurality of lead guide grooves for receiving the plurality of leads of the semiconductor device.

3. The socket as recited in claim 1, wherein said cover further comprises a plurality of out-leads, one of said out-leads being connected to each said plurality of probes, for communicating electrical signals to and from outside the semiconductor device.

4. The socket as recited in claim 1, wherein said urging means comprises a spring.

* * * * *